US009521781B2

United States Patent
Frank et al.

(10) Patent No.: US 9,521,781 B2
(45) Date of Patent: Dec. 13, 2016

(54) POWER COMPONENT DEVICE

(71) Applicants: Thomas Frank, Lauf (DE); Bernhard Kalkmann, Schwabach (DE); Liane Müller-Schmidt, Altdorf (DE); Sven Teuber, Winkelhaid (DE)

(72) Inventors: Thomas Frank, Lauf (DE); Bernhard Kalkmann, Schwabach (DE); Liane Müller-Schmidt, Altdorf (DE); Sven Teuber, Winkelhaid (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 408 days.

(21) Appl. No.: 14/104,913

(22) Filed: Dec. 12, 2013

(65) Prior Publication Data
US 2014/0176272 A1   Jun. 26, 2014

(30) Foreign Application Priority Data

Dec. 12, 2012  (DE) .......................... 10 2012 222 959

(51) Int. Cl.
*H05K 7/20*  (2006.01)
*H01F 27/22*  (2006.01)
*H01F 27/06*  (2006.01)

(52) U.S. Cl.
CPC ............ *H05K 7/2039* (2013.01); *H01F 27/06* (2013.01); *H01F 27/22* (2013.01)

(58) Field of Classification Search
None
See application file for complete search history.

(56) References Cited

U.S. PATENT DOCUMENTS 5,137,836 A * 8/1992 Lam ..................... H01L 21/485
29/593
5,268,814 A * 12/1993 Yakubowski ........... H01L 23/10
174/16.3
(Continued)

FOREIGN PATENT DOCUMENTS

DE      70 20 066       9/1970
DE      195 38 642      4/1997
(Continued)

OTHER PUBLICATIONS

German Patent Office, Examination Report from Priority Application, Jul. 5, 2013.

*Primary Examiner* — Xanthia C Cunningham
(74) *Attorney, Agent, or Firm* — The Law Offices of Roger S. Thompson

(57) ABSTRACT

A power component device includes a heat sink having a recess with a base surface and a first side surface. The first side surface of the recess is at a generally acute angle relative to the base surface. The power component device includes a first passive electrical component with a support element, having a first side surface which faces the first side surface of the recess, and is at generally the same angle relative to the base surface as the first side surface of the recess is relative to the base surface. A pressure transmission element has a first side surface which is averted from the first side surface of the support element. The base surface is at a generally acute angle relative to the first pressure transmission side surface. A pressure generating apparatus presses the support element against the first side surface of the recess.

17 Claims, 2 Drawing Sheets

(56) References Cited

U.S. PATENT DOCUMENTS

| | | | | |
|---|---|---|---|---|
| 5,396,403 A * | 3/1995 | Patel | | H01L 23/433 257/713 |
| 6,222,733 B1 * | 4/2001 | Gammenthaler | | H01F 27/22 165/80.3 |
| 6,943,443 B2 * | 9/2005 | Nobori | | H01L 23/492 257/668 |
| 7,185,696 B2 | 3/2007 | Schaper | | |
| 7,242,584 B2 * | 7/2007 | Kroneder | | H01L 24/49 257/678 |
| 7,301,755 B2 * | 11/2007 | Rodriguez | | H05K 7/1432 165/185 |
| 7,639,500 B2 | 12/2009 | Lang | | |
| 7,786,570 B2 * | 8/2010 | Eom | | H01L 23/367 257/706 |
| 7,892,893 B2 * | 2/2011 | Obara | | H01L 23/49861 257/676 |
| 7,944,042 B2 * | 5/2011 | Yoshihara | | H01L 23/36 257/690 |
| 8,054,633 B2 * | 11/2011 | Suwa | | B60L 1/003 361/637 |
| 8,446,727 B2 * | 5/2013 | Yoshida | | H01L 23/367 361/709 |
| 8,482,904 B2 * | 7/2013 | Darroman | | H02M 7/003 361/624 |
| 8,570,132 B2 * | 10/2013 | Doo | | H01F 27/025 336/90 |
| 8,630,093 B2 * | 1/2014 | Kadomoto | | H05K 7/20 361/717 |
| 2002/0034088 A1 * | 3/2002 | Parkhill | | H01L 23/50 363/144 |
| 2002/0089056 A1 * | 7/2002 | Eady | | H05K 7/1424 257/712 |
| 2003/0090358 A1 * | 5/2003 | Morimoto | | H01L 24/49 337/269 |
| 2003/0183950 A1 * | 10/2003 | Bolken | | H01L 21/563 257/786 |
| 2004/0218375 A1 * | 11/2004 | Fronk | | H05K 7/209 361/813 |
| 2007/0051974 A1 * | 3/2007 | Azuma | | H01L 24/40 257/177 |
| 2007/0246812 A1 * | 10/2007 | Zhuang | | H01L 25/115 257/678 |
| 2008/0117602 A1 * | 5/2008 | Korich | | H01G 2/08 361/715 |
| 2008/0130223 A1 * | 6/2008 | Nakamura | | H02M 7/003 361/689 |
| 2008/0164831 A1 * | 7/2008 | Miller | | H02P 1/18 318/445 |
| 2010/0208427 A1 * | 8/2010 | Horiuchi | | H05K 7/20927 361/699 |
| 2010/0219758 A1 * | 9/2010 | Melzner | | F21K 9/00 315/113 |
| 2011/0100598 A1 | 5/2011 | Gommel | | |
| 2011/0110625 A1 * | 5/2011 | Chatigny | | H01S 3/06704 385/29 |
| 2011/0216507 A1 * | 9/2011 | Kadomoto | | H05K 7/20 361/714 |
| 2012/0057371 A1 * | 3/2012 | Kai | | F21V 3/00 362/646 |
| 2012/0139684 A1 * | 6/2012 | Kobayashi | | H01F 27/022 336/92 |
| 2012/0139686 A1 * | 6/2012 | Christoph | | H01F 27/263 336/221 |
| 2013/0069454 A1 * | 3/2013 | Motoda | | H02K 11/33 310/52 |

FOREIGN PATENT DOCUMENTS

| | | |
|---|---|---|
| DE | 103 26 458 | 1/2005 |
| DE | 10 2004 019 382 | 5/2006 |
| DE | 10 2009 044 368 | 5/2011 |

* cited by examiner

POWER COMPONENT DEVICE

BACKGROUND OF THE INVENTION

1. Field of the Invention

The invention relates to a power component device.

2. Description of the Related Art

In order to cool passive electrical components, such as chokes, transformers, electrical resistors and capacitors for example, the passive electrical components are routinely attached to a heat sink by means of screws, clips or by potting.

To ensure effective heat dissipation of the heat which is generated by the passive electrical components during operation to the heat sink, it is desirable for the passive electrical component in question to be in contact with the heat sink on as many of its side surfaces as possible. In known power component devices which have a passive electrical component and a heat sink, it is therefore often necessary to match the shape of the heat sink to the shape of the passive electrical component, so that as much heat as possible can be transmitted from the passive electrical component to the heat sink. This makes the production of power component devices which are routine in the art complicated from a technical point of view since different heat sinks have to be produced for different passive electrical components to ensure effective cooling of the respective passive electrical component. This problem is further exacerbated if the power component device has a plurality of, possibly different, passive electrical components which are intended to be cooled by means of a single heat sink of the power component device.

SUMMARY OF THE INVENTION

It is therefore an object of the invention to provide an improved power component device which can be matched to different passive electrical components and in which effective cooling of the respective passive electrical component is ensured.

This object is achieved by a power component device having a heat sink which has a recess. The recess has a base surface and a first side surface, which is at an angle relative to the base surface of less than about 90°. The power component device also has a first passive electrical component with a support element arranged on the base surface and the first side surface of the support element. The first side surface of the support element faces the first side surface of the recess, and is at the same angle, relative to the base surface, as the first side surface of the recess is relative to the base surface. The power component device further has a pressure transmission element which is arranged on the base surface, and the pressure transmission element has a first pressure transmission element side surface which is averted from the first side surface of the support element. The base surface is at an angle relative to the first pressure transmission element side surface of less than about 90°. The power component device also has a pressure generating apparatus which exerts a force onto the first pressure transmission element side surface, to press the support element against the first side surface of the recess.

It has proven advantageous to arrange the pressure transmission element opposite a second side surface of the support element, which second side surface is averted from the first side surface of the support element, since the force from the pressure transmission element can be easily transmitted to the support element in the direction of the first side surface of the recess.

Furthermore, it has proven advantageous when the base surface is at an angle relative to the second side surface of the support element of less than about 90°, and the base surface is at substantially the same angle, most preferably the exact same angle, relative to a second pressure transmission element side surface of the pressure transmission element. In this embodiment, the second pressure transmission element side surface faces the second side surface of the support element, as the base surface relative to the second side surface of the support element since the support element is then pressed against the base surface of the recess in the region of the second side surface of the support element. This provides a particularly good thermal connection of the support element to the base surface of the recess.

Furthermore, it has likewise proven advantageous to form the pressure transmission element integrally with the support element. A power component device of particularly simple construction can be realized in this way.

Furthermore, it has also proven advantageous when the recess has a second side surface, which faces the first side surface of the recess, and forms the side surface of a first side wall of the heat sink, wherein the first side wall of the heat sink absorbs the force which opposes the force which the pressure generating apparatus exerts on the first pressure transmission element side surface. A power component device of particularly simple construction can be realized in this way.

It has further proven advantageous when the first passive electrical component is in the form of one of: 1) a transformer with a magnetically permeable core or 2) a choke with a magnetically permeable core and the support element is in the form of the magnetically permeable core of the transformer or of the choke, or 3) an electrical resistor and the support element is in the form of the housing of the electrical resistor, or 4) a capacitor and the support element is in the form of the housing of the capacitor. Transformers, chokes, electrical resistors and capacitors represent conventional embodiments of passive electrical components.

Furthermore, it has proven advantageous to provide a first thermally conductive layer between the support element and the base surface, and a second thermally conductive layer between the support element and the first side surface of the recess. A particularly good thermal connection of the support element to the base surface and to the first side surface of the recess can be achieved in this way.

Furthermore, it has likewise proven advantageous when the thicknesses of the first and second layer are different and/or the material from which the first and the second thermally conductive layer are composed is different since, in this case, the respective thermal transfer resistance between the support element and the base surface, and between the support element and the first side surface of the recess, can be set in a targeted manner.

Furthermore, it has also proven advantageous when the power component device has a second passive electrical component with a support element, wherein the support element of the second passive electrical component is arranged in the same form as the support element of the first passive electrical component in the recess of the heat sink and is connected to the heat sink since identical or different passive electrical components can be cooled by means of a single heat sink.

Furthermore, it has proven advantageous when the second passive electrical component is in the form of 1) a transformer with a magnetically permeable core or 2) a choke with a magnetically permeable core and the support element of the second passive electrical component is in the form of the magnetically permeable core of the transformer or of the choke, or 3) an electrical resistor and the support element of the second passive electrical component is in the form of the housing of the electrical resistor, or 4) a capacitor and the support element of the second passive electrical component is in the form of the housing of the capacitor. Transformers, chokes, electrical resistors and capacitors represent conventional embodiments of passive electrical components.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Exemplary embodiments of the invention are illustrated in the figures and will be explained in greater detail in the text which follows. In the figures.

DETAILED DESCRIPTION OF THE PRESENTLY PREFERRED EMBODIMENTS

Figure 1:
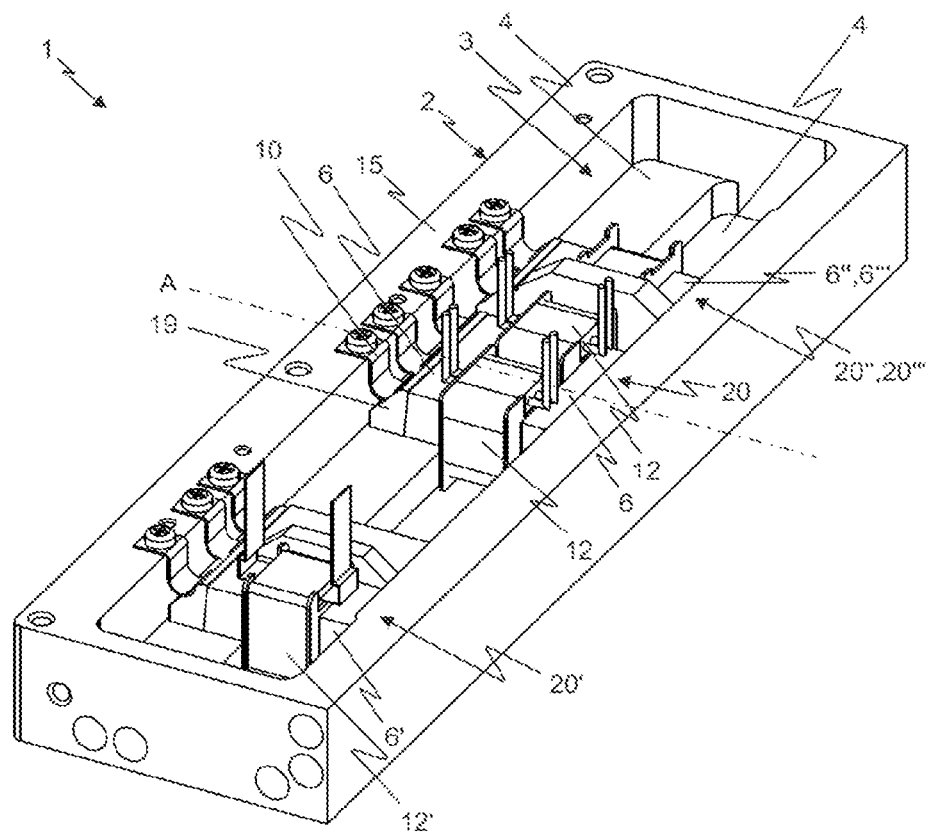
FIG. 1 shows a schematic perspective of a power component device according to the invention.
Figure 2:
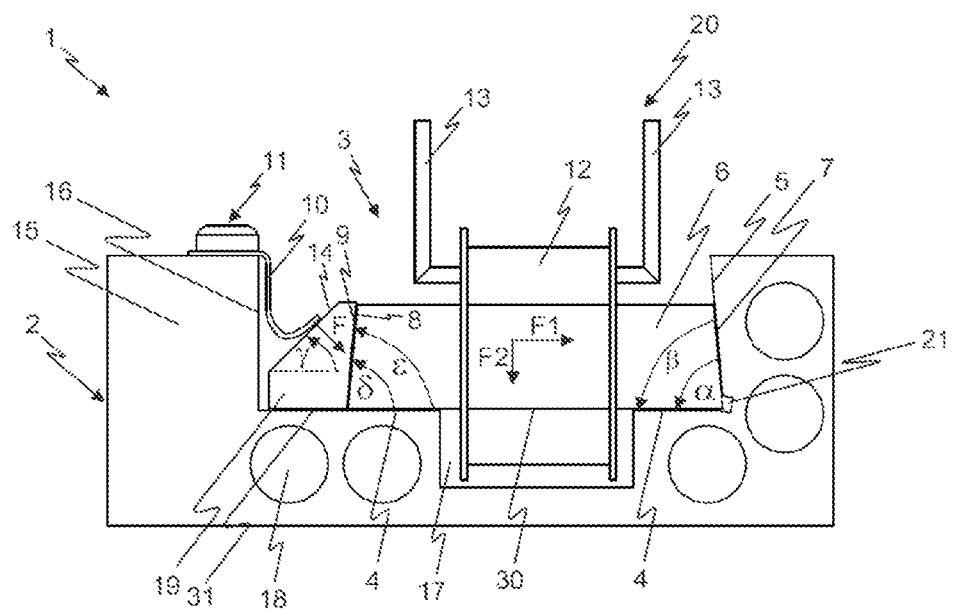
FIG. 2 shows a schematic sectional view of a power component device according to the invention.

FIG. 1 shows a schematic perspective of the inventive power component device 1. FIG. 2 shows a schematic sectional illustration, which is associated with FIG. 1, of a section through power component device 1 along line A in FIG. 1.

It should be noted at this point that, in the text which follows and as illustrated in the figures, all angles are indicated in the anticlockwise direction. It should further be noted that, for the purposes of the invention, an angle between two surfaces which do not physically intersect is understood to be the respective angle in question between the intersecting imaginary virtual extensions of the two surfaces in question.

Power component device 1 includes a heat sink 2 having a recess 3. Recess 3 has a base surface 4 and a first side surface 5, wherein first side surface 5 of recess 4 is at an angle α relative to the base surface 4 of less than about 90°. First side surface 5 of recess 4 is preferably at an angle α relative to the base surface 4 of less than about 88°, and most preferably less than about 85°.

Furthermore, power component device 1 has a first passive electrical component 20 with a support element 6 arranged on base surface 4 of recess 3. Within the scope of the exemplary embodiment, first passive electrical component 20 is in the form of a transformer and the support element 6 is in the form of the magnetically permeable core of the transformer, it being possible for the said core to be, for example, in the form of a core having iron alloy sheets or in the form of a ferrite core. The transformer has coils 12 which run around the core. Coils 12 are connected to electrical connections 13. As an alternative, first passive electrical component 20 can also be in the form of, for example, a choke and the support element 6 can be in the form of the magnetically permeable core of the choke which can be, for example, in the form of a core having iron alloy sheets or in the form of a ferrite core.

As an alternative, first passive electrical component 20 can also be in the form of an electrical resistor and support element 6 can be in the form of the housing of the electrical resistor, or first passive electrical component 20 can be in the form of a capacitor and the support element 6 can be in the form of the housing of the capacitor.

Support element 6 includes a first side surface 7, which faces first side surface 5 of recess 3, and is at an angle β relative to base surface 4. Angle β generally corresponds to angle α. Preferably, they are the same. First side surface 7 of support element 6 corresponds to first side surface 5 of recess 3. In the exemplary embodiment, first side surface 7 of support element 6 is arranged opposite first side surface 5 of recess 3. Support element 6 includes a ground surface 30 which faces base surface 4, and runs generally parallel to base surface 4 of recess 3.

Power component device 1 has a pressure transmission element 19 which is arranged on base surface 4 and has a first pressure transmission element side surface 14 which is averted from first side surface 7 of support element 6. Base surface 4 is at an angle γ relative to first pressure transmission element side surface 14 of less than about 90° and in particular of less than about 88°. Base surface 4 is preferably at an angle γ relative to first pressure transmission element side surface 14 of from about 20° to about 70°. A ground surface 31 of the pressure transmission element 19, faces base surface 4, and runs parallel to base surface 4. Pressure transmission element 19 is preferably arranged opposite a second side surface 8 of support element 6, which second side surface is averted from first side surface 7 of the support element 8. Second pressure transmission element side surface 9 of pressure transmission element 19 faces second side surface 8 of support element 6, and is preferably arranged so as to correspond to second side surface 8 of support element 6. Furthermore, second pressure transmission element side surface 9 of pressure transmission element 19 is preferably arranged opposite second side surface 8 of support element 6.

Power component device 1 further has a pressure generating apparatus 10 which exerts a force F onto first pressure transmission element side surface 14, to press support element 6 against first side surface 5 of recess 3. Pressure generating apparatus 10 is preferably in the form of a spring element which can be provided, for example, in the form of a clip 10. A force F1 is split by the force F and acts parallel to base surface 4 in the direction of first side surface 5 of recess 3 to press support element 6 against first side surface 5 of recess 3. Since first side surface 5 of recess 3 is at angle α relative to base surface 4 of less than about 90°, support element 6 is pressed against base surface 4 of recess 3 in the region of first side surface 7 of support element 6 and therefore achieves a good thermal connection between support element 6 and base surface 4. The smaller the angle α, the greater the force with which support element 6 is pressed against base surface 4 of recess 3 in the region of first side surface 7. Since first side surface 5 of recess 3 is at an angle α relative to base surface 4 of less than about 90°, support element 6 is further prevented from being able to move away from base surface 4. This creates an interlocking connection between support element 6 and first side surface 5 of recess 3, and therefore an interlocking connection between support element 6 and heat sink 2. It should be noted that, as in the exemplary embodiment, power component device 1 can also have a plurality of pressure generating apparatus 10 which together exert force F onto first pressure transmission element side surface 14, and therefore the magnitude of force F can be set in a targeted manner by adjusting the number of pressure generating apparatus 10 used.

For manufacture-related reasons, heat sink 2 preferably has a groove 21 on that edge at which base surface 4 and first side surface 7 of support element 6 meet. The heat which is generated by first passive electrical component 12 is transmitted to heat sink 2 by contact with first side surface 7 of support element 6 and base surface 30 of support element 6. Furthermore, the heat which is generated by first passive electrical component 12 is transmitted to pressure transmission element 19 by second side surface 8 of support element 6 and to heat sink 2 by pressure transmission element 19, so that first passive electrical component 12 is cooled from three sides and is therefore cooled very effectively. Pressure transmission element 19 is preferably composed of a highly thermally conductive material, such as copper or aluminum for example.

Within the scope of the exemplary embodiment, base surface 4 of recess 3 is at an angle δ relative to second side surface 8 of support element 6 of less than about 90°. Base surface 4 of recess 3 is preferably at an angle δ relative to second side surface 8 of support element 6 of less than about 88°, and in particular of less than about 85°. Base surface 4 of recess 3 is at substantially the same angle relative to second pressure transmission element side surface 9 of pressure transmission element 19, which second pressure transmission element side surface faces the second side surface 8 of support element 6, as base surface 4 of recess 3 is relative to second side surface 8 of support element 6, that is to say an angle ε of base surface 4 of recess 3 relative to second pressure transmission element side surface 9 of pressure transmission element 19 corresponds to the angle δ between base surface 4 of recess 3 and second side surface 8 of support element 6. Second pressure transmission element side surface 9 is preferably arranged so as to correspond to second side surface 8 of support element 6. In the exemplary embodiment, second pressure transmission element side surface 9 is arranged opposite second side surface 8 of support element 6.

Since base surface 4 of recess 3 is at an angle δ relative to second side surface 8 of support element 6 of less than about 90°, support element 6 is pressed against base surface 4 of recess 3 in the region of second side surface 8 of support element 6.

Since first side surface 5 of recess 3 is at an angle α relative to base surface 4 of less than about 90° and base surface 4 of recess 3 is at an angle δ relative to second side surface 8 of support element 6 of less than about 90°, support element 6 is pressed against base surface 4 of recess 3 with a total force F2 and thereby achieving a very good thermal connection between support element 6 and base surface 4.

Within the scope of the exemplary embodiment, recess 3 has a second side surface 16, which faces first side surface 5 of recess 3 and forms the side surface of a first side wall 15 of heat sink 2, wherein first side wall 15 of heat sink 2 absorbs the force which opposes force F exerted by pressure generating apparatus 10 on first pressure transmission element side surface 14. To this end, pressure generating apparatus 10 is preferably connected to first side wall 15 of heat sink 2 by a screw connection 11. It should be noted here that screw connection 11 is illustrated only in a highly schematic manner in FIGS. 2 to 4, for clarity, by showing only the screw head of the associated screw. As an alternative, first side wall 15 of heat sink 2 or base surface 4 of recess 3 can also have a mating bearing, for example in the form of an edge, against which spring element 10 presses, or pressure generating apparatus 10 can be connected to base surface 4 of recess 3, for example, by a screw connection.

Heat sink 2 preferably has a cutout 17 in recess 3, cutout 17 being cut out from a portion of base surface 4. A portion of a respective coil 12 of transformer 20 is preferably arranged in cutout 17. It should be noted here that the coil 12 is illustrated in a highly schematic manner in the form of a plan view in FIGS. 2 to 4 for clarity.

Figure 3:
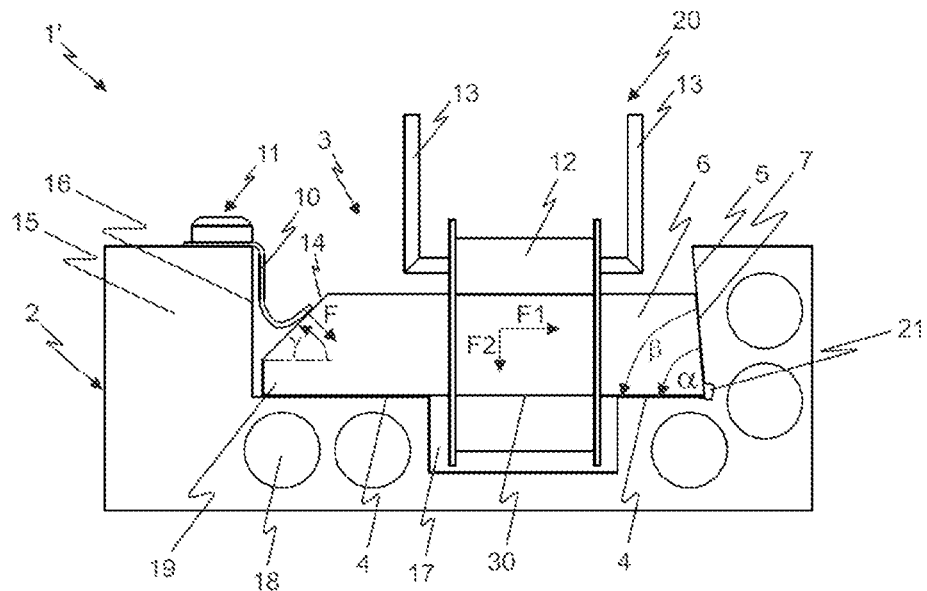
FIG. 3 shows a schematic sectional view of a further embodiment of the power component device according to the invention.

FIG. 3 shows a schematic sectional view of a further embodiment of a power component device 1' according to the invention, which power component device 1' corresponds to the above-described inventive power component device 1, apart from the feature that pressure transmission element 19 is integrally formed with support element 6. A power component device of particularly simple construction can be realized in this way.

Figure 4:
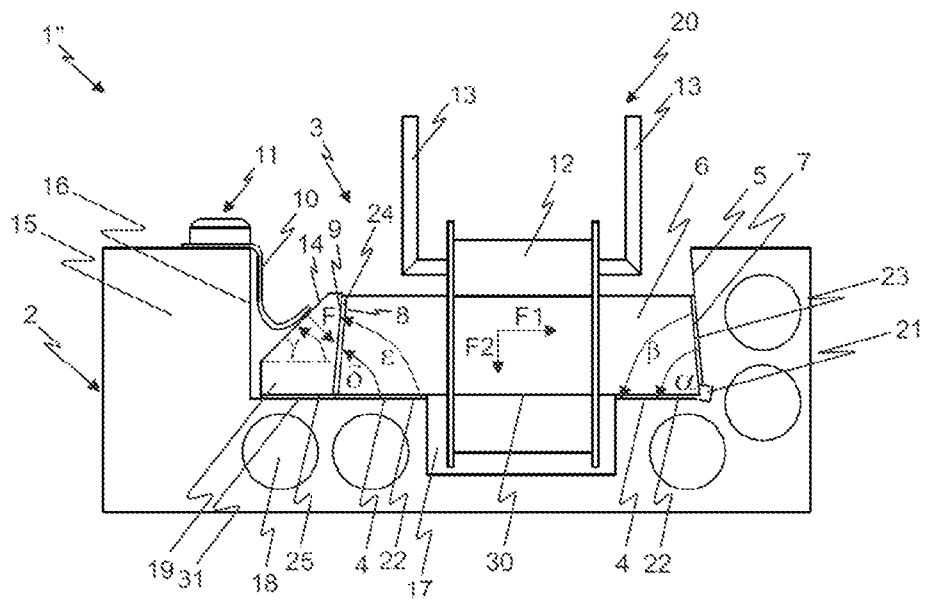
FIG. 4 shows a schematic sectional view of a further embodiment of the power component device according to the invention.

FIG. 4 shows a schematic sectional view of a further embodiment of an inventive power component device 1", which power component device 1" corresponds to inventive power component device 1, wherein, in the embodiment of the invention according to FIG. 4, a first thermally conductive layer 22 is arranged between support element 6 and base surface 4 and a second thermally conductive layer 23 is arranged between support element 6 and first side surface 5 of recess 3. In addition, a third thermally conductive layer 24 can also preferably be arranged between support element 6 and second pressure transmission element side surface 9 and/or a fourth thermally conductive layer 25 can preferably be arranged between the pressure transmission element 19 and base surface 4. The thicknesses of first, second, third and/or of the fourth layer 22, 23, 24, 25 can be different or partly different and/or the materials from which layers 22, 23, 24, 25 are composed can be different or partly different in this case. Layers 22, 23, 24 and/or 25 are preferably composed of a thermally conductive paste, wherein if the layers or some of the layers are intended to be composed of different materials, the layers or some of the layers can be composed of different thermally conductive pastes which have a different thermal conductivity. However, it goes without saying that the layers 22, 23, 24 and/or 25 can each also be in the form of a solid body. By targeted selection of the thickness of the layers or the thickness of the layers in some of the layers and/or by targeted selection of the material of the layers or of the material in some of the layers, the respective thermal transfer resistance can be set in a targeted manner and therefore have the effect, for example, that the passive electrical component 20 can be effectively cooled but, during operation of the passive electrical component 20, passive electrical component 20 is not excessively cool, but rather assumes a specific desired operating temperature during operation, at which temperature it operates, for example, with a particularly high quality and/or in a particularly reliable manner.

It also goes without saying that first and the second thermally conductive layers 22 and 23 can also be identical, as described above in the exemplary embodiment of the invention according to FIG. 3 and therefore power component device 1' can likewise have a correspondingly designed first and second thermally conductive layers 22 and 23.

In addition to the first passive electrical component, inventive power component devices 1, 1' and 1" can have further passive electrical components with respective support elements, which components are arranged in the recess of the heat sink in the same form as the first passive electrical component and are connected to the heat sink. In this case, the passive electrical components can differ both in respect of type (transformer, choke, electrical resistor, capacitor) and also in respect of size and/or shape. Therefore, it is possible to cool identical or different passive electrical components by means of a single heat sink. In this case, the pressure transmission element of the respective passive electrical component can be integrally formed with support element 6 or else not integrally formed with support element 6.

Therefore, as illustrated in FIG. 1, the inventive power component device can have, for example, a second passive electrical component 20' with a respective support element 6', wherein support element 6' of second passive electrical component 20' is arranged in recess 3 of heat sink 2 in the same form as is support element 6 of first passive electrical component 20 and is connected to heat sink 2, so that the above description relating to first passive electrical component 20 also applies to second passive electrical component 20'. In the exemplary embodiment, second passive electrical component 20' is in the form of a choke and support element 6' of second passive electrical component 20' is in the form of a magnetically permeable core. A coil 12' of the choke runs around the magnetically permeable core.

Furthermore, as illustrated in FIG. 1, the inventive power component device can have, for example, a third passive electrical component 20" or 20''' with a support element 6" or 6''', wherein support element 6" or 6''' of third passive electrical component 20" or 20''' is arranged in recess 3 of heat sink 2 in the same form as support element 6 of first passive electrical component 20 and is connected to heat sink 2, so that the above description relating to first passive electrical component 20 also applies to third passive electrical component 20" or 20'''. In the exemplary embodiment, third passive electrical component 20" or 20''' is in the form of an electrical resistor 20" and support element 6" of third passive electrical component 20" is in the form of the housing of the electrical resistor or the third passive electrical component 20''' is in the form of a capacitor 20''' and support element 6''' of third passive electrical component 20''' is in the form of the housing of the capacitor.

The heat sink can be in the form of, for example, an air heat sink or, as in the exemplary embodiment, in the form of a liquid heat sink. In the exemplary embodiment, heat sink 2 has channels 18 which run through heat sink 2, a cooling liquid, which is preferably in the form of water or an oil, flowing through channels 18 and drawing heat from heat sinks and discharging the said heat to the outside during operation of the power component device 1. When the heat sink is in the form of an air heat sink, the heat sink generally has cooling fins, air flowing past the said cooling fins for cooling purposes and drawing heat from heat sinks and discharging the said heat to the outside during operation.

It should be noted at this point that, within the meaning of the invention, a heat sink is understood to be a solid body which serves to draw heat from another solid body and to emit the drawn heat or a major portion of the drawn heat to a liquid medium and/or to a gaseous medium, which is in contact with the heat sink, during operation of the power component device. A small portion of the heat which is drawn from the heat sink can optionally be emitted to a further solid body.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power component device comprising:
    a heat sink having a recess, wherein said recess includes a base surface and a first side surface which is at an angle ($\alpha$) relative to said base surface of less than about 90°;
    a first passive electrical component having a support element arranged on said base surface, and to insert said support element having a first side surface facing said first side surface of said recess, and which is at substantially the same angle ($\alpha$) relative to said base surface as said first side surface of said recess relative to said base surface;
    a pressure transmission element arranged on said base surface having a first pressure transmission element side surface which is averted from said first side surface of said support element, wherein said base surface is at an angle ($\gamma$) relative to said first pressure transmission element side surface of less than about 90°; and
    a pressure generating apparatus capable of exerting a force (F) onto said first pressure transmission element side surface, to press said support element against said first side surface of said recess.

2. The power component device of claim 1, wherein said support element includes a second side surface which is arranged opposite to said pressure transmission element, and which is averted from said first side surface of said support element.

3. The power component device of claim 2, wherein said pressure transmission element includes a second pressure transmission element side surface which second pressure transmission element side surface faces the same side of said second side surface of said support element, as said base surface relative to said second side surface of said support element;
    wherein said base surface is at an angle ($\delta$) relative to said second side surface of said support element of less than about 90°, and said base surface is at the same angle ($\delta$) relative to said second pressure transmission element side surface.

4. The power component device of claim 1, wherein said pressure transmission element is integrally formed with said support element.

5. The power component device of claim 1,
wherein said recess has a second side surface, which faces said first side surface of said recess and forms a side surface of a first side wall of said heat sink; and
wherein said first side wall of said heat sink absorbs a force which opposes the force (F) which the pressure generating apparatus exerts on said first pressure transmission element side surface.

6. The power component device of claim 1, wherein said first passive electrical component is in the form of a transformer with a magnetically permeable core and the support element is in the form of the magnetically permeable core of the transformer.

7. The power component device of claim 1, wherein said first passive electrical component is in the form of a choke with a magnetically permeable core and the support element is in the form of the magnetically permeable core of the choke.

8. The power component device of claim 1, wherein said first passive electrical component is in the form of an electrical resistor and the support element is in the form of the housing of the electrical resistor.

9. The power component device of claim 1, wherein said first passive electrical component is in the form of a capacitor and the support element is in the form of the housing of the capacitor.

10. The power component device of one claim 1, further comprising a first thermally conductive layer arranged between said support element and said base surface, and a second thermally conductive layer arranged between said support element and said first side surface of said recess.

11. The power component device of claim 10, wherein the thicknesses of said first and second layer are different and/or the material from which the first and the second thermally conductive layer is composed is different.

12. The power component device of claim 10, wherein said first and said second thermally conductive layers are composed of different materials.

13. The power component device of claim 1, further comprising a second passive electrical component with a support element, wherein said support element of said second passive electrical component is arranged in the same form as said support element of said first passive electrical component in said recess of said heat sink and is connected to said heat sink.

14. The power component device of claim 13, wherein said second passive electrical component is in the form of a transformer with a magnetically permeable core and said support element of said second passive electrical component is in the form of said magnetically permeable core of said transformer.

15. The power component device of claim 13, wherein said second passive electrical component is in the form of a choke with a magnetically permeable core and said support element of said second passive electrical component is in the form of the magnetically permeable core of the choke.

16. The power component device of claim 13, wherein said second passive electrical component is in the form of an electrical resistor and said support element of said second passive electrical component is in the form of a housing of said electrical resistor.

17. The power component device of claim 13, wherein said second passive electrical component is in the form of a capacitor and said support element of said second passive electrical component is in the form of said housing of said capacitor.

* * * * *